(12) United States Patent
Schallmoser

(10) Patent No.: US 9,119,299 B2
(45) Date of Patent: Aug. 25, 2015

(54) PRINTED CIRCUIT BOARD WITH VIBRATION-GENERATING ELECTRONIC COMPONENT

(75) Inventor: Oskar Schallmoser, Ottobrunn (DE)

(73) Assignee: OSRAM Gesellschaft mit beschrankter Haftung, Munich (DE)

( * ) Notice: Subject to any disclaimer, the term of this patent is extended or adjusted under 35 U.S.C. 154(b) by 1069 days.

(21) Appl. No.: 12/309,118

(22) PCT Filed: Jul. 21, 2006

(86) PCT No.: PCT/EP2006/007215
§ 371 (c)(1),
(2), (4) Date: Jan. 7, 2009

(87) PCT Pub. No.: WO2008/009308
PCT Pub. Date: Jan. 24, 2008

(65) Prior Publication Data
US 2012/0067634 A1  Mar. 22, 2012

(51) Int. Cl.
*H05K 1/16*  (2006.01)
*H05K 1/02*  (2006.01)

(52) U.S. Cl.
CPC ............ *H05K 1/0271* (2013.01); *H05K 1/0231* (2013.01); *H05K 2201/09036* (2013.01); *H05K 2201/09063* (2013.01); *H05K 2201/1003* (2013.01); *H05K 2201/10636* (2013.01); *H05K 2201/2045* (2013.01)

(58) Field of Classification Search
USPC .......................... 174/250–268; 361/736–812; 248/80–88, 155.1–155.5, 166–173, 248/180.1–186.2, 229.1–231.51, 271.4, 248/292.14, 316.1–316.8; 292/1–62, 113, 292/169.11–169.23, 341.11–341.19; 74/141–169, 380–387
See application file for complete search history.

(56) References Cited

U.S. PATENT DOCUMENTS 5,453,580 A * 9/1995 Franke et al. ............... 174/250

FOREIGN PATENT DOCUMENTS

| DE | 28 38 288 | | 9/1978 |
| EP | 0 654 959 A1 | | 11/1994 |
| GB | 2 394 365 A | | 10/2002 |
| JP | 58062917 A | | 4/1983 |
| JP | 60-57152 U | | 4/1985 |
| JP | 2000277883 A | | 10/2000 |
| JP | 2003152286 A | | 5/2003 |
| JP | 2004119624 A | * | 4/2004 ............... H05K 1/02 |
| JP | 2005237540 A | | 9/2005 |
| JP | 2006140740 A | | 6/2006 |

* cited by examiner

*Primary Examiner* — Jerry Wu
(74) *Attorney, Agent, or Firm* — Holtz, Holtz, Goodman & Chick PC

(57) ABSTRACT

Surface mounted ceramic capacitors (14) on printed circuit boards (10') are subject to vibrations (18) caused by the piezo effect. Other electronic components are subject to magnetostriction and likewise generate vibrations. In prior art, the vibrations can propagate (20) on a printed circuit board (10). To suppress the propagation of the vibrations caused by the electronic component (14), the invention provides at least one slot (22) in the printed circuit board (10'). The slot (22) extends, for example, parallel to a side wall of the electronic component (14).

16 Claims, 1 Drawing Sheet

PRINTED CIRCUIT BOARD WITH VIBRATION-GENERATING ELECTRONIC COMPONENT

This application is a U.S. National Phase Application under 35 USC 371 of International Application PCT/EP2006/007215, filed Jul. 21, 2006, which is incorporated herein in its entirety by this reference.

TECHNICAL FIELD

The invention relates to a printed circuit board, on which at least two conductor tracks are arranged, to which an electronic component is connected which triggers oscillations during operation.

PRIOR ART

It is known that a printed circuit board is a relatively thin, flat plate which is usually made from plastic. The conductor tracks are generally produced from copper, the copper typically being applied electrochemically to the printed circuit board. "Operation" of the electronic component is understood to mean that the electronic component has current flowing through it or that at least a feed voltage is present.

One example of an electronic component which triggers oscillations during operation is a ceramic capacitor. Since the ceramic capacitor is mounted on the printed circuit board, it is also referred to as a surface-mounted ceramic capacitor (SMD ceramic capacitor, surface mounted device). Ceramic capacitors demonstrate a piezoelectric effect. The material contracts under voltage and/or expands under voltage. Depending on the voltage applied, a movement can be introduced, in particular a periodic, i.e. oscillatory movement. The surface-mounted ceramic capacitor transmits the oscillations to the printed circuit board to which it is fixed. Even if the oscillation of the ceramic capacitor has only a very low amplitude under the piezoelectric effect, considerable oscillations in the printed circuit board may result since the forces acting are very great. The oscillating printed circuit board generates sound and therefore undesirable perceptible noise. Even in the case of other electronic components, oscillations can be introduced. For example, electrostatic and electrodynamic forces may take effect. Ferrites demonstrate so-called magnetostriction. A ferrite magnet coil can therefore likewise trigger oscillations.

Several starting points are given in the prior art as to how the development of noise towards the outside can be prevented. A first starting point consists in improving the fixing of the sound-emitting components to the printed circuit board. Owing to the need for the provision of electrical contacts, said contacts cannot always be effectively decoupled, however. The sound frequencies in the control signals which are supplied to the electronic components can be selected such that the mechanical oscillations demonstrate corresponding frequencies which do not generate sound in the audible range. Finally, the generation of sound can also initially be accepted and, in a housing in which the printed circuit board is accommodated, a sound-damping measure can then be implemented, for example as a result of the use of elastic casting compounds, sound-absorbing or damping mats.

DESCRIPTION OF THE INVENTION

The object of the invention is to develop a printed circuit board of the type mentioned at the outset in such a way that sound is effectively suppressed.

According to the invention, at least one slot is provided in the printed circuit board. The slot is used for preventing the propagation of oscillations triggered by the electronic component over the printed circuit board. This can be understood such that the electronic component can initially trigger oscillations in its direct region of influence, but these oscillations only propagate as far as the slot on the side of the slot on which the electronic component is arranged and not beyond the slot, i.e. on the side of the slot on which the electronic component is not arranged. Since a printed circuit board generally has a flat surface on which the (copper) conductor tracks are formed, the slot produces an interruption in the flat surface, with the result that surface waves and transverse oscillations of the printed circuit board beyond the slot are suppressed.

In a preferred embodiment, two slots are provided, to be precise on opposite sides of the electronic component. The sound propagation is therefore interrupted in two directions. It is of course also possible for yet another slot to be provided on a third side of the electronic component. The slots therefore cannot completely surround the electronic component since the conductor tracks need to pass outside at some point.

In a preferred embodiment, at least one of the slots runs parallel to a side wall of the electronic component. Express reference is made to the fact that this feature does not require the side wall of the electronic component to be in a straight line. If the side wall is curved, the slot is curved parallel thereto. The feature "parallel" merely includes that the respectively shortest connecting line between the side wall and the slot is in each case perpendicular to the tangent at the contour of the side wall or of the slot. The preferred embodiment that a slot runs parallel to the side wall of the electronic component is especially advantageous in particular when the electronic component is connected in the region of the side wall, i.e. with one end, to the conductor tracks. By means of the electrical connection of the electronic component to the conductor tracks, which results along with a mechanical connection, mechanical coupling-in of the oscillations generally takes place. If the slot runs parallel to the side wall of the electronic component, the slot is arranged in such a way that in each case approximately the same phase of the oscillation which is triggered by the electronic component passes to the slot, that is over the entire length. As a result, the oscillation is suppressed particularly efficiently.

An example of the shape of an electronic component (for example of a typical surface-mounted ceramic capacitor) is a component with a rectangular base area, i.e. with two long and two short side walls. The slot can run parallel to the short side wall or the long side wall (and is then naturally a straight line).

In a preferred embodiment, at least one of the slots, which runs parallel to a side wall of the electronic component, is longer than the side wall. The slot thus protrudes beyond the width of the side wall on at least one side, preferably on both sides. Expedient are (in the case of a slot which is 50 μm to 2 mm wide) values of up to 1 mm or moreover up to 2 mm for the amount by which the slot is longer than the side wall.

In addition to the abovementioned surface-mounted ceramic capacitor, the electronic component may be a (ferrite) magnet coil. The invention can be used on all electronic components which could trigger oscillations and transmit them to the printed circuit board during operation, i.e. when a current is flowing through them or when a voltage is applied.

BRIEF DESCRIPTION OF THE DRAWINGS

A preferred embodiment of the invention will be described below with reference to the drawing, in which.

PREFERRED EMBODIMENT OF THE INVENTION

Figure 1:
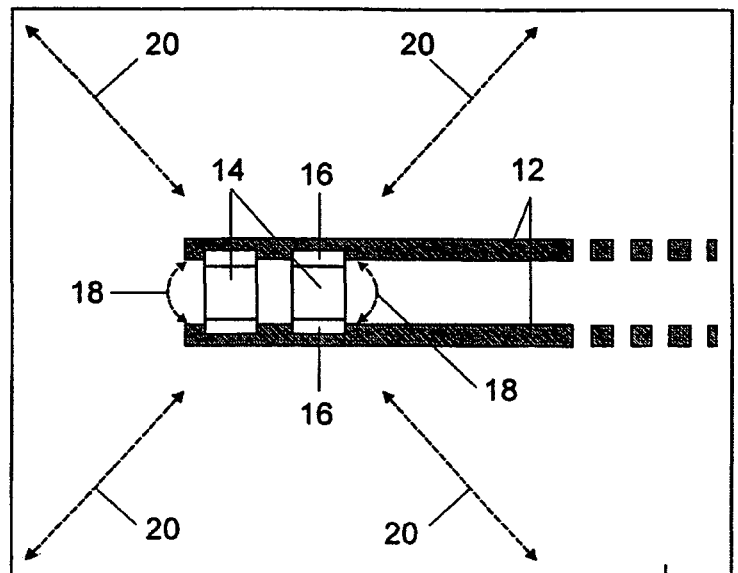
FIG. 1 shows a plan view of a printed circuit board with an electronic component in accordance with the prior art.

FIG. 1 shows a plan view of a printed circuit board in accordance with the prior art. A printed circuit board is a plastic plate on which electrical conductor tracks made from copper are formed. In order to symbolically illustrate the plate shape, the printed circuit board is characterized as a whole by a rectangle and denoted by 10. The figure shows, by way of example, two conductor tracks 12, whose size is not represented true to scale in relation to the printed circuit board 10. The dotted formation at the right-hand end of the conductor tracks 12 in the illustration in FIG. 1 is intended to indicate that the conductor tracks can be continued in any desired way on the printed circuit board. The contact region of the conductor track 12 on which two ceramic capacitors 14 are connected is of interest. The ceramic capacitors 14 are naturally likewise shown in plan view. They have a rectangular outline and are connected to contact regions 16 in each case on one of the conductor tracks 12.

During operation of the ceramic capacitors 14, the piezoelectric effect takes place, i.e. the ceramic capacitors 14 are shortened and lengthened, for example periodically. The movement is indicated by the arrows 18, which are curved since the ceramic capacitors 14 also expand in the direction perpendicular to the plane of the paper in FIG. 1. The ceramic capacitors 14 transmit these oscillations to the entire printed circuit board 10 via the contact regions 16, which is illustrated by the arrows 20. At no point is the propagation of the oscillations which are illustrated by the arrows 20 impeded. The entire printed circuit board 10 begins to oscillate and emits sound, and disruptive noise is the result.

Figure 2:
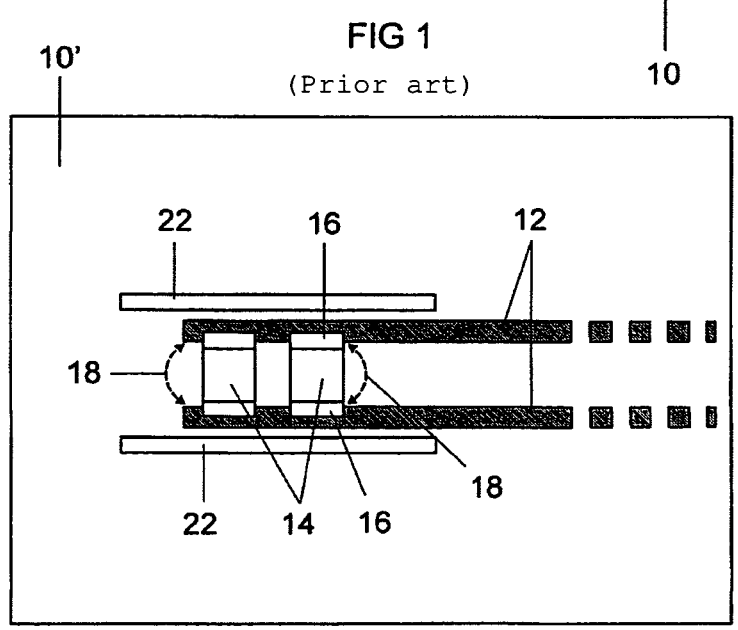
FIG. 2 shows a plan view of a printed circuit board with an electronic component in accordance with an embodiment of the invention.

FIG. 2 now shows a printed circuit board 10' according to the invention in a plan view in an illustration similar to that in FIG. 1. According to the invention, two slots 22 are provided in the printed circuit board 10', for example are milled in. Each slot 22 runs parallel to the short side wall of the ceramic capacitors 14, which have a rectangular base area. The slots 22 run in particular parallel to the contact regions 16. The slots are slightly lengthened on both sides of the capacitors. The slots 22 do not end in the extension of the long side wall on the left-hand side in FIG. 2 of the ceramic capacitor 14 shown on the left, but extend slightly further, lengthening the remaining profile towards the left into the printed circuit board 10'. The slots also do not end in the extension of the long side wall on the right-hand side in FIG. 2 of the ceramic capacitor 14 shown on the right, but protrude towards the right in an extension of their remaining extent. The slots 22 suppress propagation of oscillations. In this case, too, the ceramic capacitors 14 oscillate, as is indicated by the arrows 18. However, the oscillations can at best be transmitted to the printed circuit board in the region between the slots 22. However, they cannot propagate beyond the slots 22 in the region beyond the slots 22 (ceramic capacitors are "on this side"). Large-area propagation of the sound as in the prior art (cf. arrows 20 in FIG. 1) is suppressed by the slots 22.

As a result, the emission of sound is effectively prevented.

In the form illustrated, the slots 22 are also parallel to the conductor tracks 12. It would also be possible for further suppression of the emission of sound to form an additional slot parallel to the long side wall on the left-hand side in FIG. 2 of the ceramic capacitor 14 shown on the left. Any restrictions result from a possible instability of the printed circuit board.

The shape of the slots cannot in any case be formed so ideally as in the case of the slots 22 illustrated. In particular, the shape and the course of conductor tracks can be determined by the shape of the slots. It is thus not always possible for a strip-shaped contact region 16 to be formed which for its part is parallel to the course of the conductor track and with respect to which a slot 22 can be formed parallel. It is instead possible for contact regions of the ceramic capacitors with the conductor tracks to be non-rectangular, for example if the conductor tracks for their part are not strip-shaped. Ideally, the positioning of a slot depends on how sound propagation would take place in the printed circuit board without the presence of the slot since the slots are of course intended to prevent propagation of oscillations triggered by the ceramic capacitor over the printed circuit board.

A printed circuit board according to the invention can have a large number of ceramic capacitors. It is not always possible for a slot to be formed at the same time for two ceramic capacitors. Instead it is possible for slots to be formed individually for each ceramic capacitor in the printed circuit board in the vicinity of the ceramic capacitor. Naturally, several ceramic capacitors, as illustrated in FIG. 2, may possibly be surrounded together by slots.

The invention claimed is:

1. A printed circuit board comprising:
   at least two spaced apart conductor tracks arranged on the printed circuit board, and
   an electronic component which is connected to the at least two conductor tracks and which triggers mechanical oscillations during operation, thereby propagating acoustic waves in the printed circuit board,
   wherein:
   a base area of the electronic component has at least two substantially straight side walls opposing each other, and
   the printed circuit board comprises exactly two spaced apart substantially straight slots respectively arranged on opposite sides of the electronic component, the two slots running parallel to respective ones of the at least two substantially straight side walls of the electronic component and being formed in the printed circuit board so as to prevent propagation of the acoustic waves triggered during operation of the electronic component in the printed circuit board;
   wherein each of the two slots is formed entirely within an outer peripheral edge of the printed circuit board and is parallel to at least a part of the at least two conductor tracks.

2. The printed circuit board as claimed in claim 1, wherein the base area of the electronic component is rectangular.

3. The printed circuit board as claimed in claim 1 or 2, wherein the two slots are adjacent to respective ones of the at least two conductor tracks with the at least two conductor tracks being interposed between the two slots.

4. The printed circuit board as claimed in claim 1, wherein the base area of the electronic component is rectangular with two long and two short side walls, and the two slots run in a straight line parallel to the respective short side walls.

5. The printed circuit board as claimed in claim 1, wherein the base area of the electronic component is rectangular with two long and two short side walls, and the two slots run in a straight line parallel to the respective long side walls.

6. The printed circuit board as claimed in claim 1, wherein at least one of the two slots is longer than the side wall of the electronic component to which it is adjacent.

7. The printed circuit board as claimed in claim 1, wherein the electronic component comprises a surface-mounted ceramic capacitor.

8. The printed circuit board as claimed in claim 1, wherein the electronic component comprises a magnet coil.

9. The printed circuit board as claimed in claim 4, wherein at least one of the two slots is longer than at least one of the two short side walls of the electronic component.

10. The printed circuit board as claimed in claim 5, wherein at least one of the two slots is longer than at least one of the two long side walls of the electronic component.

11. The printed circuit board as claimed in claim 1, wherein the at least two conductor tracks are parallel to each other.

12. The printed circuit board as claimed in claim 11, wherein the at least two conductor tracks are parallel to the two slots.

13. The printed circuit board as claimed in claim 1, wherein at least two of the electronic components are provided.

14. The printed circuit board as claimed in claim 1, wherein (i) the at least two conductor tracks, (ii) the at least two side walls of the electronic component, (iii) the two substantially straight slots, and (iv) side walls of the printed circuit board all extend in directions parallel to each other.

15. The printed circuit board as claimed in claim 1, wherein each of the two slots is provided apart from its respective side wall of the electronic component at a distance such that a substantially same phase of the mechanical oscillations triggered by the electronic component during operation passes to the slot over an entire length of the slot.

16. The printed circuit board as claimed in claim 1, wherein each of the two slots has four sides.

* * * * *